United States Patent
Chen et al.

(10) Patent No.: US 9,949,359 B2
(45) Date of Patent: Apr. 17, 2018

(54) MULTI-LAYER THIN-FILM COATINGS FOR SYSTEM-IN-PACKAGE ASSEMBLIES IN PORTABLE ELECTRONIC DEVICES

(71) Applicant: Apple Inc., Cupertino, CA (US)

(72) Inventors: Yanfeng Chen, San Ramon, CA (US); Shankar S. Pennathur, San Jose, CA (US)

(73) Assignee: Apple Inc., Cupertino, CA (US)

( * ) Notice: Subject to any disclaimer, the term of this patent is extended or adjusted under 35 U.S.C. 154(b) by 268 days.

(21) Appl. No.: 14/308,463

(22) Filed: Jun. 18, 2014

(65) Prior Publication Data
US 2015/0271911 A1   Sep. 24, 2015

Related U.S. Application Data

(60) Provisional application No. 61/955,063, filed on Mar. 18, 2014.

(51) Int. Cl.
*H05K 1/18* (2006.01)
*H05K 9/00* (2006.01)
(Continued)

(52) U.S. Cl.
CPC ............. *H05K 1/0216* (2013.01); *H05K 1/18* (2013.01); *H05K 3/284* (2013.01); *H05K 3/30* (2013.01);
(Continued)

(58) Field of Classification Search
CPC .... H05K 1/185; H05K 2201/10; H05K 3/284; H05K 2201/09872; H05K 2203/1377;
(Continued)

(56) References Cited

U.S. PATENT DOCUMENTS 5,461,545 A * 10/1995 Leroy ................... H05K 3/284
                                              174/17.05
5,483,261 A    1/1996 Yasutake
(Continued)

FOREIGN PATENT DOCUMENTS

CN    102054821 A    5/2011
EP    0 130 279 A2   1/1985
(Continued)

OTHER PUBLICATIONS

International Search Report dated Nov. 23, 2015, for PCT Application No. PCT/US2015/028654, filed Apr. 30, 2015, nine pages.
(Continued)

*Primary Examiner* — Binh Tran
(74) *Attorney, Agent, or Firm* — Morrison & Foerster LLP

(57) ABSTRACT

A portable electronic device packaged into a System-in-Package assembly is disclosed. The portable electronic device can include a substrate and a plurality of components mounted on the substrate and included in one or more subsystems. Interference between subsystems or from external sources can be reduced or eliminated by disposing an insulating layer over the components, forming narrow trenches between subsystems, and depositing one or more layers of a multi-layer thin film stack on the insulating layer and filling the trenches. In some examples, the multi-layer thin film stack can include an adhesion layer, a shielding layer, a protection layer, and a cosmetic layer. In some examples, the multi-layer thin film stack can include multifunctional layers such as a protection and cosmetic layer.

16 Claims, 12 Drawing Sheets

(51) Int. Cl.
  *H05K 1/02* (2006.01)
  *H05K 3/28* (2006.01)
  *H05K 3/30* (2006.01)
  *H05K 7/00* (2006.01)

(52) U.S. Cl.
  CPC ............. *H05K 9/00* (2013.01); *H05K 9/0081* (2013.01); *H05K 1/0218* (2013.01); *H05K 2201/09972* (2013.01); *H05K 2201/10371* (2013.01); *H05K 2203/1322* (2013.01); *Y10T 29/49146* (2015.01)

(58) Field of Classification Search
  CPC ........... H05K 3/285; H05K 2201/0707; H05K 9/0081; H05K 9/0022; C23C 14/04; C23C 18/06; C23C 18/1603; H01L 23/28
  USPC ....... 361/760, 761, 762, 765, 777, 816, 818; 174/521
  See application file for complete search history.

(56) References Cited

U.S. PATENT DOCUMENTS

| | | | |
|---|---|---|---|
| 5,488,204 A | 1/1996 | Mead et al. | |
| 5,639,989 A * | 6/1997 | Higgins, III | H01L 23/552 174/386 |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,625,026 B1 | 9/2003 | Boudreaux et al. | |
| 6,690,387 B2 | 2/2004 | Zimmerman et al. | |
| 6,858,930 B2 | 2/2005 | Miller et al. | |
| 7,015,894 B2 | 3/2006 | Morohoshi | |
| 7,184,064 B2 | 2/2007 | Zimmerman et al. | |
| 7,187,060 B2 | 3/2007 | Usui | |
| 7,663,607 B2 | 2/2010 | Hotelling et al. | |
| 7,808,781 B2 | 10/2010 | Colgan et al. | |
| 8,212,340 B2 | 7/2012 | Liao | |
| 8,304,289 B2 | 11/2012 | Usui et al. | |
| 8,373,256 B2 * | 2/2013 | Kaneko | H01L 23/5225 257/659 |
| 8,479,122 B2 | 7/2013 | Hotelling et al. | |
| 8,536,713 B2 | 9/2013 | Teig | |
| 2002/0034066 A1 | 3/2002 | Huang et al. | |
| 2003/0155987 A1* | 8/2003 | Kolb | H04B 15/02 333/12 |
| 2004/0194988 A1 | 10/2004 | Chen | |
| 2005/0167849 A1 | 8/2005 | Sato | |
| 2006/0131735 A1 | 6/2006 | Ong et al. | |
| 2006/0197753 A1 | 9/2006 | Hotelling | |
| 2008/0211088 A1 | 9/2008 | Sato | |
| 2009/0000114 A1* | 1/2009 | Rao | H01L 23/552 29/832 |
| 2009/0079041 A1 | 3/2009 | Huang et al. | |
| 2009/0115037 A1 | 5/2009 | How et al. | |
| 2009/0127700 A1 | 5/2009 | Romig | |
| 2010/0207257 A1 | 8/2010 | Lee | |
| 2010/0285636 A1 | 11/2010 | Chen | |
| 2010/0319981 A1 | 12/2010 | Kapusta et al. | |
| 2011/0005662 A1 | 1/2011 | Sung | |
| 2011/0162828 A1 | 7/2011 | Kirk et al. | |
| 2012/0044653 A1 | 2/2012 | Morris | |
| 2012/0243191 A1 | 9/2012 | Wu | |
| 2015/0271959 A1 | 9/2015 | Chen et al. | |
| 2015/0382448 A1 | 12/2015 | Pennathur et al. | |

FOREIGN PATENT DOCUMENTS

| | | |
|---|---|---|
| EP | 0 777 274 A1 | 6/1997 |
| EP | 2 669 942 A2 | 12/2013 |
| EP | 2 713 683 A1 | 4/2014 |
| JP | 2000-163031 A | 6/2000 |
| JP | 2002-342033 A | 11/2002 |
| JP | 2005-109306 A | 4/2005 |
| JP | 2009-301830 A | 12/2009 |
| KR | 10-1200051 B1 | 11/2012 |
| TW | 200420218 A | 10/2004 |
| WO | WO-2013/104274 A1 | 1/2013 |
| WO | WO-2013/066751 A1 | 5/2013 |
| WO | WO-2015/142426 A1 | 9/2015 |
| WO | WO-2015/142427 A1 | 9/2015 |
| WO | WO-2015/199810 A1 | 12/2015 |

OTHER PUBLICATIONS

ROC (Taiwan) Search Report dated Dec. 15, 2015, for TW Application No. 104102913, one page.
ROC (Taiwan) Search Report dated Apr. 12, 2016, for TW Application No. 104103062, with English translation, two pages.
Non-Final Office Actin dated Jun. 17, 2016, for U.S. Appl. No. 14/503,067, filed Sep. 30, 2014, twelve pages.
International Search Report dated Apr. 21, 2015, for PCT Application No. PCT/US2015/013610, filed Jan. 29, 2015, four pages.
International Search Report dated Apr. 21, 2015, for PCT Application No. PCT/US2015/013615, filed Jan. 29, 2015, four pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Non-Final Office Action dated Nov. 2, 2016, for U.S. Appl. No. 14/308,386, filed Jun. 18, 2014, 15 pages.
Final Office Action dated Jan. 9, 2017, for U.S. Appl. No. 14/503,067, filed Sep. 30, 2014, 12 pages.
Final Office Action dated Mar. 13, 2017, for U.S. Appl. No. 14/308,386, filed Jun. 18, 2014, 12 pages.
Non-Final Office Action dated Apr. 25, 2017, for U.S. Appl. No. 14/503,067, filed Sep. 30, 2014, eight pages.
Notice of Allowance dated Jul. 28, 2017, for U.S. Appl. No. 14/503,067, filed Sep. 30, 2014, five pages.

* cited by examiner

MULTI-LAYER THIN-FILM COATINGS FOR SYSTEM-IN-PACKAGE ASSEMBLIES IN PORTABLE ELECTRONIC DEVICES

FIELD

This relates generally to mitigating interference and, more particularly, to thin film coatings to help provide electromagnetic shielding, adhesion to underlying layers, enhanced aesthetic appeal, and resistance to degradation or discoloration in System-In-Package assemblies in compact portable electronic devices.

BACKGROUND

Compact portable electronic devices are becoming increasingly popular. Examples of compact portable electronic devices include laptop computers, tablet computing devices, cellular telephones, media players, gaming devices, handheld devices, miniature devices such as pendant and wearable devices, and other devices. It is generally desirable to reduce both internal and external interference of the components in the compact portable electronic devices. The interference can be reduced or eliminated using electromagnetic shielding. For example, some electronic devices include radio-frequency transceiver circuits that are susceptible to radio-frequency interference. Electronic devices can also include memory and other components that use clock signals during normal operation. If care is not taken, signals from one circuit can interfere with the proper operation of another circuit. For example, a clock signal or a clock signal harmonic that falls within the operating band of a radio-frequency receiver can cause undesirable interference for a radio-frequency transceiver.

To protect devices from electromagnetic interference, circuits such as radio-frequency transceivers can be enclosed within metal shielding cans, or a conductive paste can be disposed between the circuits. The metal of the shielding cans or the conductive paste can block signals and can help shield the enclosed components from electromagnetic interference. To reduce the size of compact portable electronic devices, the circuitry can be integrated into a System-in-Package. However, shielding cans and conductive paste can limit the effectiveness of the shielding and can limit the size of the device. An alternative to the metal shielding cans and conductive paste are thin-film metal layers. However, the thin-film metal layers can have limited shielding effectiveness, poor adhesion to underlying layers, can be aesthetically unappealing, and can be susceptible to environment-induced degradation or discoloration.

SUMMARY

This relates to a compact portable electronic device and multi-layer thin-film coatings for System-in-Package assemblies. The compact portable electronic device can be assembled into a single package to reduce size and enhance form factor. Several tens or hundreds of electrical components including multiple dies, passive components, mechanical or optical components can be packaged in a single system on a printed circuit board. Components can be grouped and arranged into subsystems based on their functionality. Multi-layer thin films coatings can improve shielding effectiveness, enhance adhesion to underlying layers, enhance the aesthetic appeal, and prevent or reduce environment-induced degradation or discoloration.

DETAILED DESCRIPTION

Figure 1A:
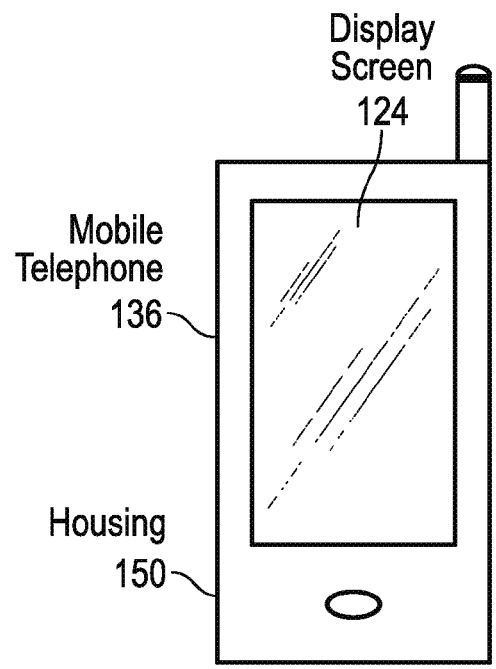
FIGS. 1A-1D illustrate example systems in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

This relates to multi-layer thin film coatings for electrical, mechanical, and optical components and subsystems in a portable electronic device assembled using System-in-Package (SiP) technology. The multi-layer thin film coatings can be used for radio-frequency shielding and/or magnetic shielding. The multi-layer thin film coatings can shield components such as integrated circuits that operate in radio-frequency bands (e.g., transceiver integrated circuits, memory circuits and other circuits). Components can also include circuitry formed from one or more discrete components such as inductors, capacitors, resistors, switches, etc. The components that are shielded can be aggressors (components that produce radio-frequency or magnetic shield interference) and/or victims (components that are sensitive to interference that is received from external sources). The multi-layer thin film coatings can help to reduce electromagnetic interference. Additionally, the multi-layer thin film coatings can provide enhanced adhesion to underlying layers, enhance aesthetic appeal, and prevent or eliminate environment-induced degradation or discoloration.

In recent years, portable electronic devices such as laptops, tablet computing devices, cellular telephones, media players, gaming devices, handheld devices, miniature devices, etc., have become small, light and powerful. One factor contributing to this reduction in size can be attributed to the manufacturer's ability to fabricate various components of these devices in smaller and smaller sizes while, in some cases, increasing the power and/or operating speed of such components. Another factor contributing to the reduction in size is that from a visual standpoint, users often find compact and sleek designs of portable electronic devices more aesthetically appealing and thus demand compact and sleek designs. The trend for smaller, lighter, more compact and powerful presents continuing challenges in the design of portable electronic devices and their associated components.

One area that enables small and compact devices can be internal packaging. A particular device can have a desired form factor and functionality. The desired form factor determines a size of the housing in which all of the device components that provide the desired functionality are packaged. The internal packaging design involves minimizing any unused dead space that does not contribute in some way to the functioning of the device while still fitting the needed components in an allotted space dictated by the form factor.

Electrical, mechanical, and optical components can be included in one or more subsystems and packaged using the System-in-Package (SiP) technology. SiP is a functional system assembled into a single package. Several tens or hundreds of components including multiple dies, passive components, and mechanical or optical components can be packaged in a single system on a printed circuit board (PCB). The PCB can be formed from rigid PCB materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails). PCBs on which components such as integrated circuit components and discrete components are mounted can sometimes be referred to as main logic boards (MLBs). The components can be mounted on the PCB using solder or other suitable mounting arrangements. For example, the components can be surface-mount technology (SMT) components that are mounted directly onto a PCB. SiP can lead to higher volumetric efficiency, superior reliability, higher performance, and smaller form factor.

PCBs having shielded components can be used in electronic devices such as desktop computers, computers built into computer monitors, television set top boxes, audio-video equipment, and portable electronic devices such as laptop computers, tablet computing devices, cellular telephones, media players, gaming devices, handheld devices, miniature devices such as pendant and wristwatch devices, or other electronic equipment.

Figure 1B:
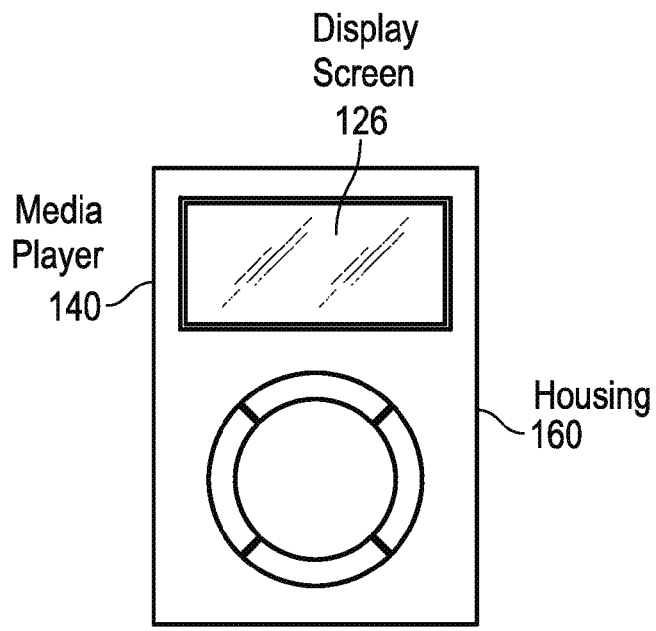
Figure 1C:
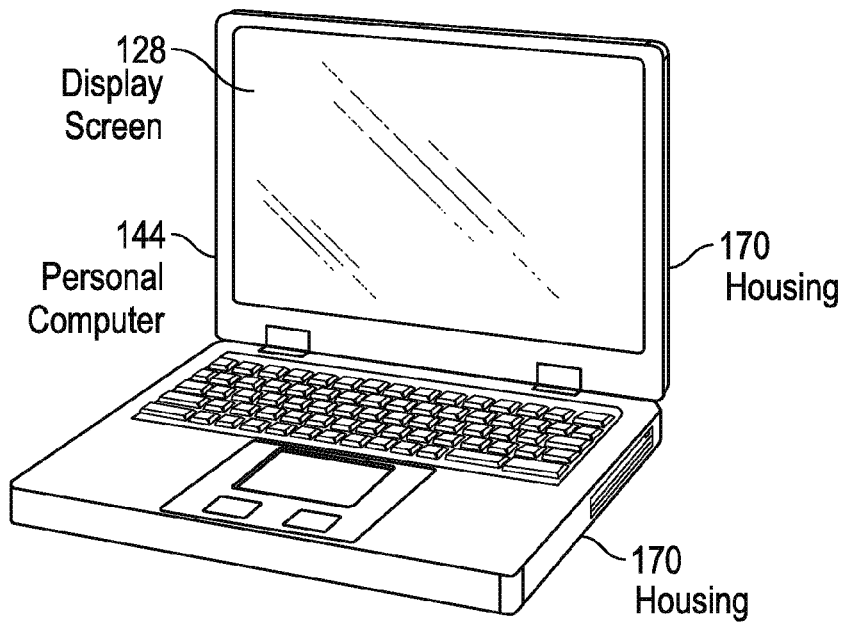
Figure 1D:
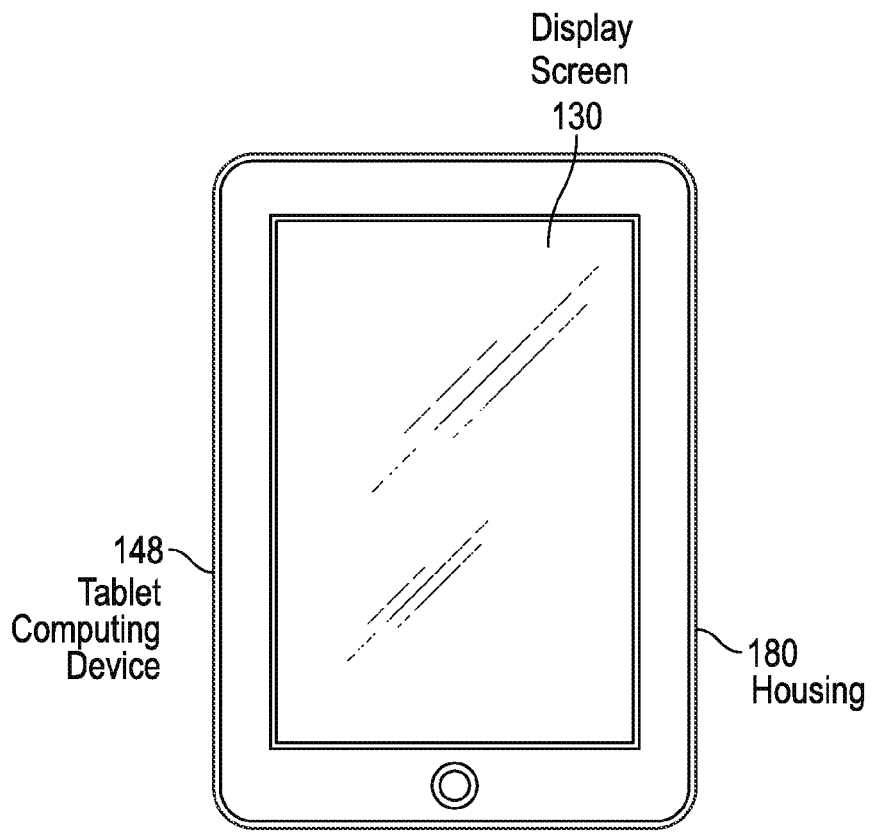

FIGS. 1A-1D illustrate systems in which examples of the disclosure can be implemented. FIG. 1A illustrates an exemplary mobile telephone 136 that includes a display screen 124 packaged in housing 150. FIG. 1B illustrates an exemplary digital media player 140 that includes a display screen 126 packaged in housing 160. FIG. 1C illustrates an exemplary personal computer 144 that includes a display screen 128 packaged in housing 170. FIG. 1D illustrates an exemplary tablet computing device 148 that includes a display screen 130 packaged in housing 180.

Figure 2A:
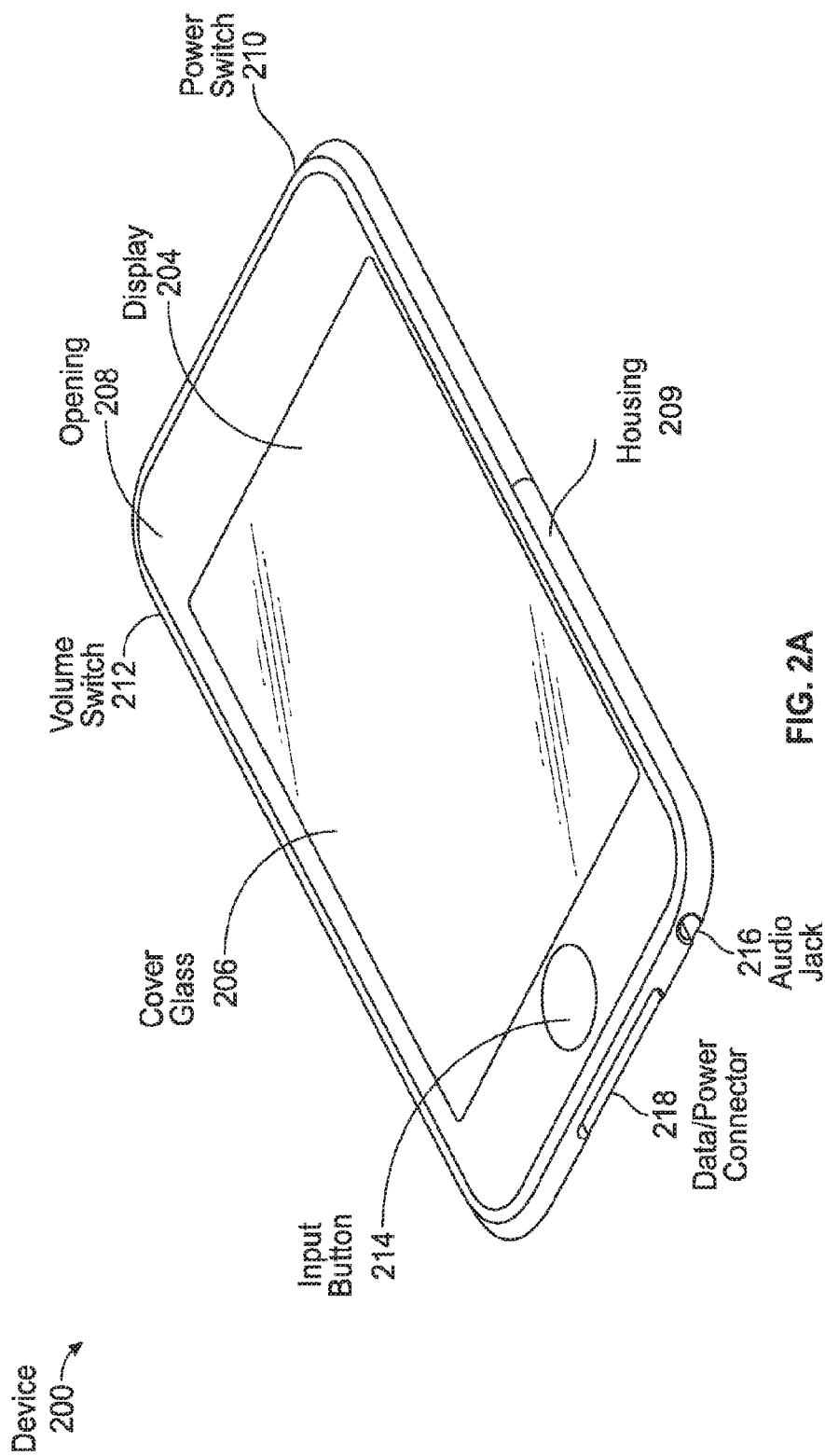
FIG. 2A illustrates a perspective view of an exemplary portable electronic device.

FIG. 2A illustrates a perspective view of an exemplary portable electronic device. Portable electronic device 200 can include a housing 209 with an opening 208. A display 204 surrounded by a frame can be positioned within the opening 208. Display circuitry for the display 204 can be located within the housing 209, such as directly below the display 204. The positioning of the display circuitry can affect the internal spaces that are available within the housing 209.

A touch screen can be associated with the display 204. Circuitry associated with the touch screen, such as touch screen controller, can be located within the housing 209. The display 204 can be sealed via a cover glass (or other material) 206. One or more input buttons, such as input button 214, can be positioned in an opening of the cover glass 206. Detection circuitry associated with the input button 214 can be located within the housing 209. In some examples, the input button 214 can be used to return the device 200 to a particular state, such as a home state.

A number of input/output mechanisms can be located around the edges of the housing. For instance, a data/power connector 218 and audio jack 216 can be located on a bottom edge of the housing 209 and a power switch 210 can be located on a top edge of the housing 209. Housing 209 can also include openings for speakers and/or microphones. Circuitry supporting these components can be packaged internally within the housing 209. The circuitry can be embodied on various circuit boards or on a single circuit board, such as in System-in-Package assemblies, disposed within the housing.

Figure 2B:
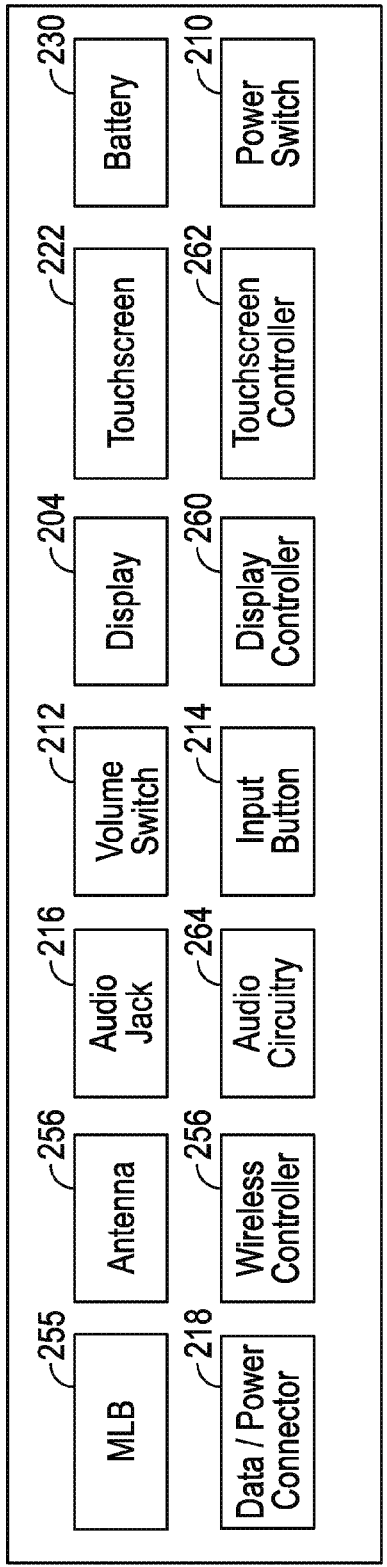
FIG. 2B illustrates a block diagram of an exemplary portable electronic device.

A block diagram of device 200 is shown in FIG. 2B. The components described above can be controlled by a processor on a MLB 255. Various internal connections can be provided that allow data to move between the MLB 255 and the various components. The routing of internal data connections can depend on how various components are packaged, including where the MLB 255 can be positioned within the housing 209 and available internal pathways that result after the positioning of the various internal device components.

In regards to data connections, MLB 255 can be connected to a display controller 260, which can be coupled to display 204 (shown in FIG. 2A). Further, the MLB 255 can be coupled to audio components, such as a speaker, the audio jack 216 (shown in FIG. 2A), a microphone or associated audio circuitry 264 including an audio codec. Further, the MLB 255 can be coupled to the various input devices, such as touch screen 222 coupled to a touch screen controller 262, the input button circuitry, and the power switch circuitry. In addition, the MLB 255 can be connected to various data interfaces that allow it to receive and send external data, such as the wireless controller 256, which can include an antenna 266, and the data/power connector 218.

Besides data connections, many internal device components can receive power from an internal power source, such as battery 230. For instance, the battery 230 can be coupled to the MLB 255, the display 204, the display controller 260, the touch screen 222, and the data/power connector 218. Like the data connections, the routing of the power connections can depend on the positioning of the various internal device components, such as the battery 230 and the available internal pathways within the housing 209.

Figure 2C:
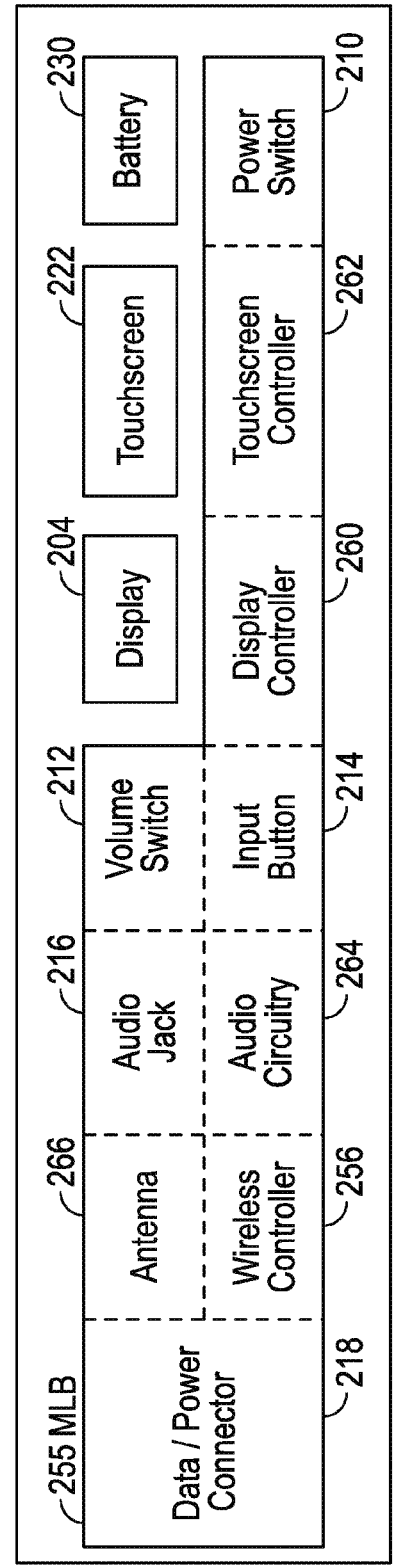
FIG. 2C illustrates a block diagram of an exemplary portable electronic device.

An exemplary block diagram of device 200 is shown in FIG. 2C. Various circuitry included in device 200 as described above can be packaged into a single package or a SiP assembly. Several tens or hundreds of electronic components including multiple dies, passive components, and mechanical or optical components can be packaged in a single system on a PCB. Antenna 266, audio jack 216, volume switch 212, data/power connector 218, wireless controller 256, audio circuitry 264, input button 214, display controller 260, touch screen controller 262, and power switch 210 can be included on the MLB 255. Packaging of the components into a SiP assembly can lead to a thinner, more compact, and sleeker device 200.

Figure 3:
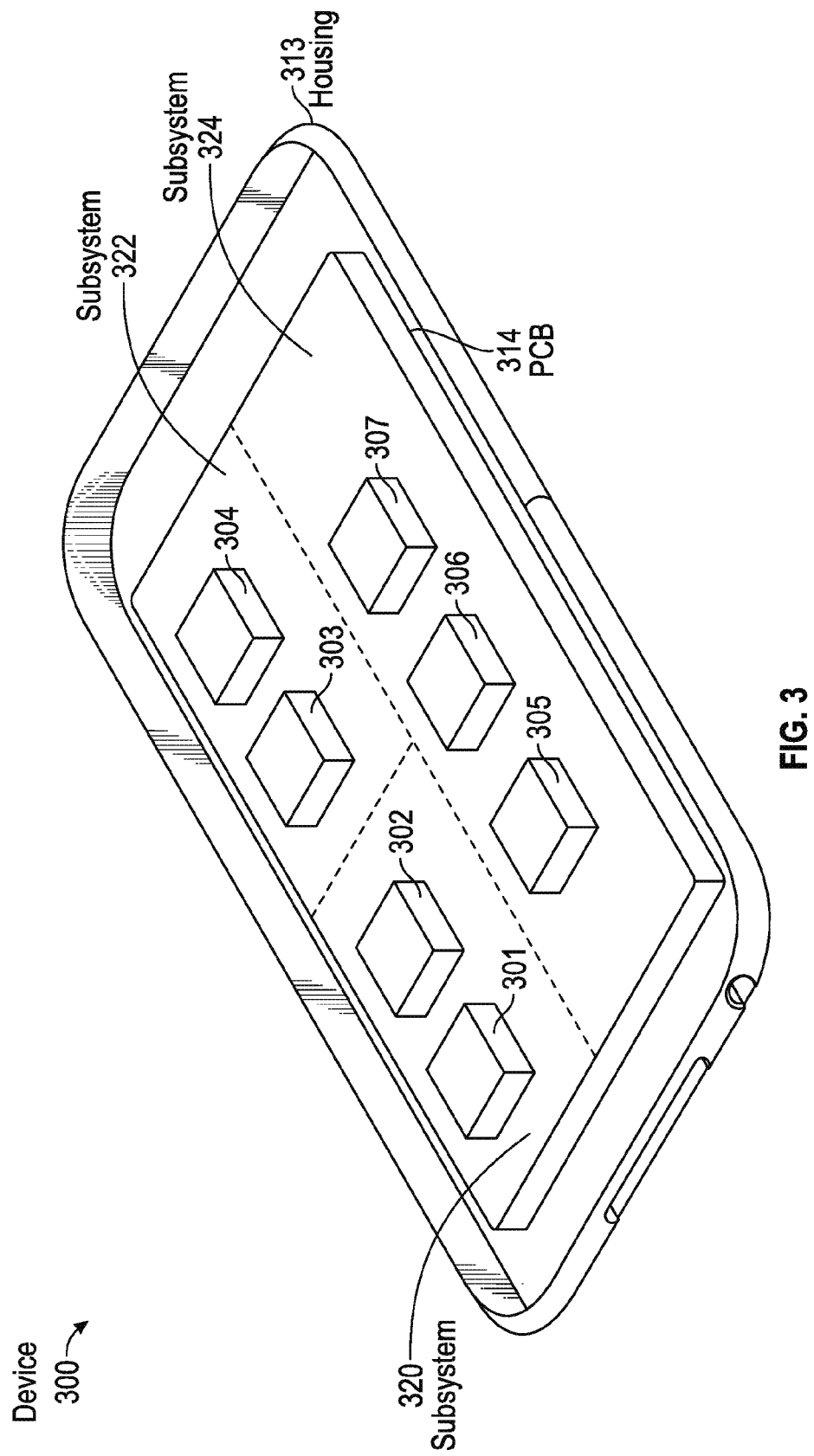
FIG. 3 illustrates a perspective view of an exemplary compact portable electronic device that includes components.

FIG. 3 illustrates a perspective view of an exemplary compact portable electronic device that includes components. Portable electronic device 300 can include housing 313. Housing 313 can be formed from metal, plastic, fiber-composite materials such as carbon fiber materials, glass, ceramics, other materials, or combinations of these materials. Housing 313 can be formed from a single piece of machined metal (e.g., using a unibody-type construction) or can be formed from multiple structures that are attached together such as an internal housing frame, a bezel or band structure, housing sidewalls, planar housing wall members, etc. Device 300 can include components 301-307 mounted on a PCB 314 within housing 313. Components 301-307 can include integrated circuits such as general purpose processing units, application-specific integrated circuits, radio-frequency components such as wireless transceivers, clock generation and distribution circuits, or other components such as discrete components. PCB 314 can be a MLB or other types of logic boards.

Some of the components 301-307 can be sensitive to electromagnetic interference (EMI). For example, a wireless transceiver component can be sensitive to radio-frequency harmonics from a system clock generation component. Some of the components 301-307 can produce radio-frequency signal interference (e.g., a cellular transceiver can emit radio-frequency signals that affect other components of device 300). Other components can generate magnetic interference (e.g., inductors in a power management system can generate magnetic fields). To ensure that the components of device 300 operate properly, it can be desirable to electromagnetically shield one or more components 301-307 on PCB 314 from each other (e.g., by covering components 301-307 with shielding structures).

Components can be grouped into different subsystems based on their functionality. For example, components 301-302 can be included in subsystem 320, components 303-304 can be included in subsystem 322, and components 305-307 can be included in subsystem 324. As an example, subsystem 320 can be designated for wireless communications and subsystem 322 can be designated for audio. It can be desirable to shield a wireless communications integrated circuit located in subsystem 320 to help insure that system noise (e.g., from clocks or other noise sources) does not interfere with proper receiver operation. It can also be desirable to shield an audio circuit located in subsystem 322 so that the audio circuit does not pick up noise from another circuit on device 300 or to shield memory circuits and processor components so that their clocks do not cause interference with other components. In some examples, it can be desirable to shield a group containing multiple components (e.g., when the components are sensitive to EMI from external sources).

Figure 4:
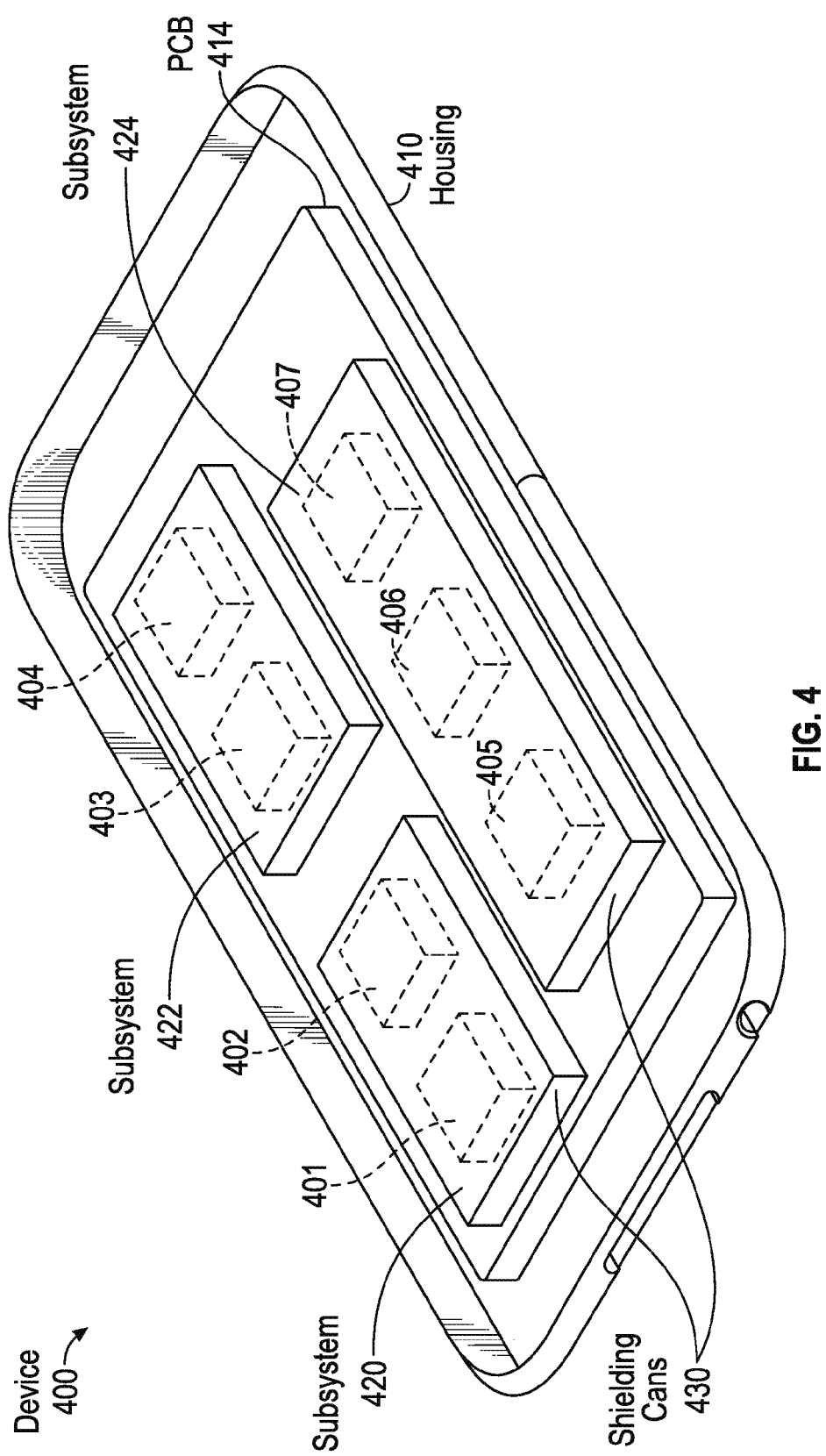
FIG. 4 illustrates an exemplary portable electronic device with metal cans used for shielding.

FIG. 4 illustrates an exemplary portable electronic device with metal shielding cans used for shielding. Portable electronic device 400 can include a PCB 414 enclosed within housing 410. Components 401-407 can be mounted or disposed on the PCB 414. Components 401-402 can be included in subsystem 420, components 402-403 can be included in subsystem 422, and components 404-407 can be included in subsystem 424. Shielding cans 430 can be used to cover components within a particular subsystem from either internal interference, external interference, or both. Shielding cans 430 can be soldered onto the PCB 414 either during or after mounting the components to the PCB 414. In some examples, the shielding cans can be made of a metal sheet or a foil.

One possible problem with the shielding cans can be that the shielding cans can occupy a significant portion of board space. Additionally, the sheet thickness of the material used for the shielding cans and additional clearance gap required above the shielding cans can lead to thicker, more bulky devices.

Figure 5:
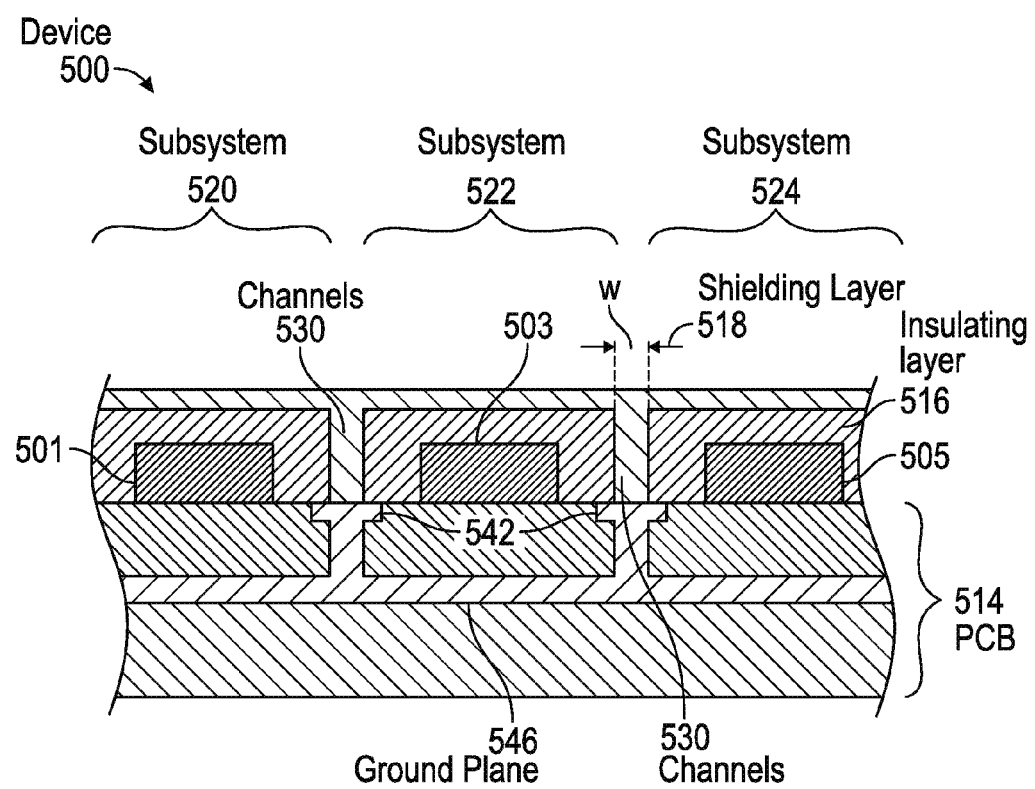
FIG. 5 illustrates a cross-sectional view of an exemplary portable electronic device with conductive paste used for shielding.

FIG. 5 illustrates a cross-sectional view of an exemplary portable electronic device with conductive paste used for shielding. Portable electronic device 500 can include a substrate or PCB 514. Components 501, 503, and 505 can be mounted or disposed on the PCB 514 using any mounting technique. Shielding structures can include an insulator or insulating layer 516 and a shielding or shielding layer 518. Shielding structures can be disposed on components 501, 503, and 505 and can selectively shield components 501, 503, and 505 from internal and/or external interference. Insulating layer 516 can be used to prevent electrical shorting between the shielding layer 518 and any conductive materials on PCB 514 (e.g., conductive portions of components 501, 503, and 505).

Insulating layer 516 can be formed from epoxy, overmolding materials, under-fill materials, heat shrink jackets, acrylic materials, dielectric materials, thermoset materials, thermoplastics, rubbers, plastics, or other desirable materials that provide electrical insulation. In some examples, insulating layer 516 can be formed using insulating materials that are electrically insulating and thermally conductive. For example, insulating material can include thermally conductive plastics, epoxy, or other thermally conductive materials. Insulating materials that are thermally conductive can be used to draw heat away from components 501, 503, and 505. For example, a radio-frequency transceiver can become undesirably hot during normal operation. In this scenario, it can be desirable to form shielding structures from insulating materials that are thermally conductive to help protect the radio-frequency transceiver from overheating. In some examples, insulating layer 516 can be used to form configurations that can include subsystems for selected components on a substrate. In some examples, insulating layer 516 can be used to form configurations that provide structural support for shielding layer 518.

Shielding layer 518 can be formed over the insulating layer 516 to shield the underlying components from EMI. Shielding layer 518 can include conductive materials such as silver paint, platinum paint, solder, metals such as copper or aluminum, metal alloys such as nickel-iron alloys, conductive adhesives, or other materials suitable for electromagnetic shielding. Shielding layer 518 can be formed in various configurations including walls, fences, sheets or layers, combinations of these configurations, or other desired configurations.

PCB 514 can include metal traces 542 and ground plane 546. Shielding layer 518 can electrically couple with metal traces 542 and ground plane 546 to form a shielding structure that encloses each subsystem and can help protect components 501, 503, and 505 from EMI (e.g., interference from external sources or between components of different subsystems). In some examples, metal traces 542 can be formed from conductive materials that help protect the PCB 514 from cutting tools. For example, metal traces 542 can reflect lasers emitted by laser cutting tools.

One possible problem with conductive paste can be its shielding effectiveness. The conductive paste can be porous and can have limited shielding capabilities due to low conductivity. Additionally, the viscosity of the conductive paste can require the width between subsystems to be wide in order for the conductive paste to fill the channels or the area between subsystems. For example, the width W (see FIG. 5) of the channels can be about 100 μm-1 mm. Furthermore, the conductive paste can require additional processing steps such as curing and baking that can lead to long manufacturing times.

In some examples, a narrow trench can be formed, and a plating film or a thin-film metal can be deposited to fill the trench. The plating film or thin-film metal can be deposited using any number of techniques, such as chemical vapor deposition, physical vapor deposition, plating, printing, or spray processes. The plating film or thin-film metal can be susceptible to peeling or limited shielding effectiveness due to poor adhesion to underlying layers. The plating film or thin-film metal can also be aesthetically unappealing and/or can be susceptible to environment-induced degradation or discoloration.

FIGS. 6A-6D illustrate cross-sectional views of an exemplary portable electronic device packaged into a System-in-Package assembly with a multi-layer thin-film stack used as shielding. FIG. 6E illustrates a flow diagram of an exemplary process for forming the portable electronic devices depicted in FIGS. 6A-6D. Portable electronic device 600 can include a substrate or PCB 614, provided in step 660 of process 650. In step 662, components 601-604 can be mounted or disposed on PCB 614 using any mounting technique. The components 601-604 can be mounted using solder or any suitable mounting material.

In step 664, insulating layer 616 can be formed on the PCB 614 using an injection process or a deposition process. For the injection process, molding tools can be used to mold insulating materials to form the insulating layer 616 and to transfer the molded insulating layer 616 to the PCB 614. Molding tools can include injection molding tools, sintering tools, matrix molding tools, compression molding tools, transfer molding tools, extrusion molding tools, and other tools suitable for molding insulating materials into a desired configuration. Molding tools can be used to form structures that define the shape and location of the subsystems 620 and 622. For the deposition process, deposition tools can be used to deposit insulating layer 616 at desired locations on the substrate or PCB 614. Deposition tools can include tools for injecting insulating materials (e.g., epoxy) into injection molding tools to form shielding structures. Deposition tools can also include thin-film deposition tools (e.g., chemical or physical vapor deposition tools) or other tools desirable for forming shielding structures.

Insulating layer 616 can be an epoxy, over-molding materials, under-fill materials, heat shrink jackets, acrylic materials, dielectric materials, thermoset materials, thermoplastics, rubbers, plastics, or other desirable materials that provide electrical insulation. In some examples, the insulating layer 616 can be formed by injecting the material into a space inside a molding structure.

In step 666, subsystems 620 and 622 can be formed and defined. Each subsystem 620 and 622 can enclose its respective components 601-602 and 603-604, and can be formed either during the molding process as described above or by scribing or etching a channel using a cutting source. When using a molding process, molding structures (not shown) can have holes through which insulating material can be injected into the space inside the molding structure. After the injection process (e.g., after insulating materials are injected and sufficiently cooled), the molding structures can be removed. The insulating materials can be heated prior and/or during injection using heating tools. Heating tools can include oil-based heating tools, gas-based heating tools, electrical-based heating tools, or any other heating tools suitable for heating insulating materials. Heating tools can, if desired, be used to apply pressure to the insulating layer 616 during formation. In some examples, the insulating layer 616 can be pre-formed and then placed on the PCB 614 over the components 601-604. When using a cutting source to define each subsystem 620 and 622, channels or trenches 630 can be formed by cutting through the insulating layer 616 using cutting tools to isolate subsystems 620 from 622. In some examples, the width of the trenches 630 can be between 10-100 nm. Cutting tools can include sawing tools, laser cutting tools, grinding tools, drilling tools, electrical discharge machining tools, or other machining or cutting tools suitable for cutting through the insulating layer 616.

In step 668, an adhesion layer 640 can be deposited on the insulating layer 616 and in the trenches 630. The adhesion layer 640 can be made of any material that has good adhesion to at least the insulating layer 616 or the subsequently formed shielding layer 642 or both. One example material for the adhesion layer 640 can be Stainless Steel. In some examples, the thickness of the adhesion layer 640 can be between 10-100 nm.

In step 670, a shielding layer 642 can be deposited on the adhesion layer 640 and in the trenches 630. The shielding layer 642 can be made of any material that has good shielding efficiency or low skin depth, high conductivity, and low cost. The skin depth is the depth at which radiation can penetrate the shielding layer 642. Materials that can be used for the shielding layer 642 can include, but are not limited to, Copper, Nickel and Silver. In some examples, the thickness of the shielding layer 642 can be between 1-100 μm. In some examples, the thickness of the shielding layer 642 can be greater than 100 μm and can be increased in order to achieve a lower skin depth.

In step 672, a protector or protection layer 644 can be deposited on the shielding layer 642 and in the trenches 630. The protection layer 644 can be made of any material that has good adhesion to the shielding layer 642 and good corrosion resistance properties. Materials that can be used for the protection layer 644 can include, but are not limited to, Stainless Steel, Gold, and Platinum.

In step 674, a cosmetic layer 646 can be deposited on the protection layer 644 and in the trenches 630. The cosmetic layer 646 can be made of any material that has the desired cosmetic properties such as color. For example, to achieve a gold color, Titanium Nitride (TiN), Gold (Au), or Zirconium Nitride (ZrN) can be deposited. To achieve a black color, Diamond-like Carbon (DLC), Boron Carbide ($B_4C$), Molybdenum Disulfide ($MoS_2$), Aluminum Titanium Nitride (AlTiN), or AlTiN/$(Mo,W)S_2$ can be deposited. To achieve a dark gray color, Silicon Carbide (SiC), AlTiN/$(Mo,W)S_2$, or Chromium Nitride (CrN) can be deposited. To achieve a silver color, Titanium Carbide (TiC), TiC/$(Mo,W)S_2$ or Silver (Ag) can be deposited. To achieve a bronze color, Titanium Nitride (TiN) or Titanium Carbon Nitride (TiCN) can be deposited. The thickness and composition of the material used for the cosmetic layer 646 can depend on the desired color. In some examples, the thickness of the cosmetic layer 646 can be 100-1000 nm.

Figure 6A:
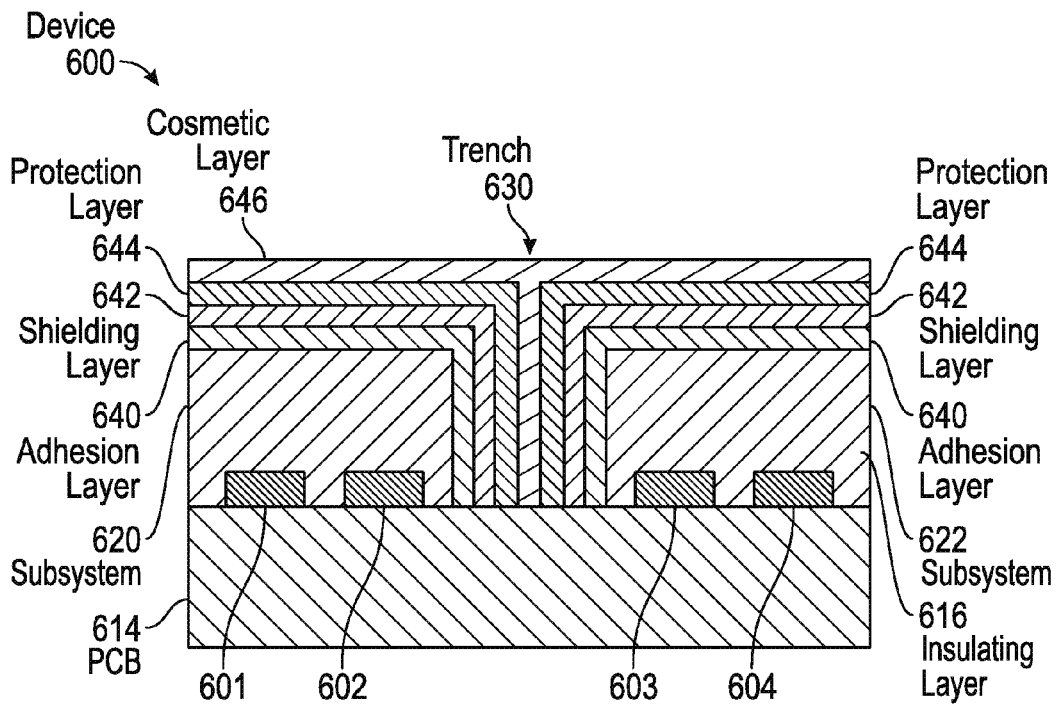
FIGS. 6A-6D illustrate cross-sectional views of an exemplary portable electronic device packaged into a System-in-Package assembly with a multi-layer thin-film stack used as shielding.
Figure 6B:
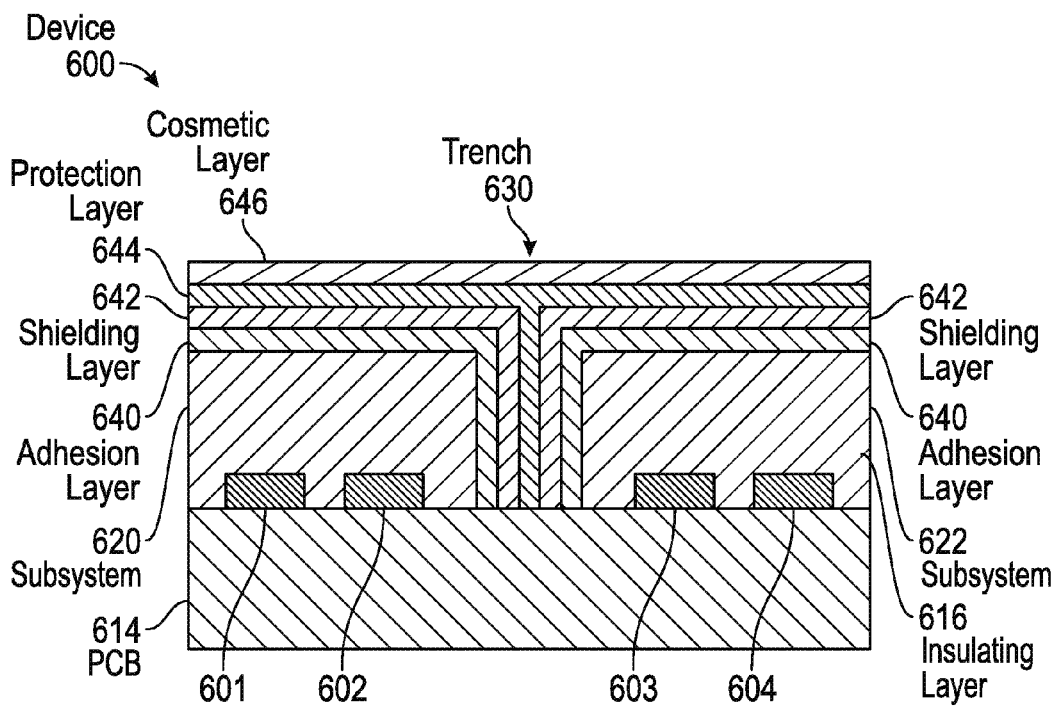
Figure 6C:
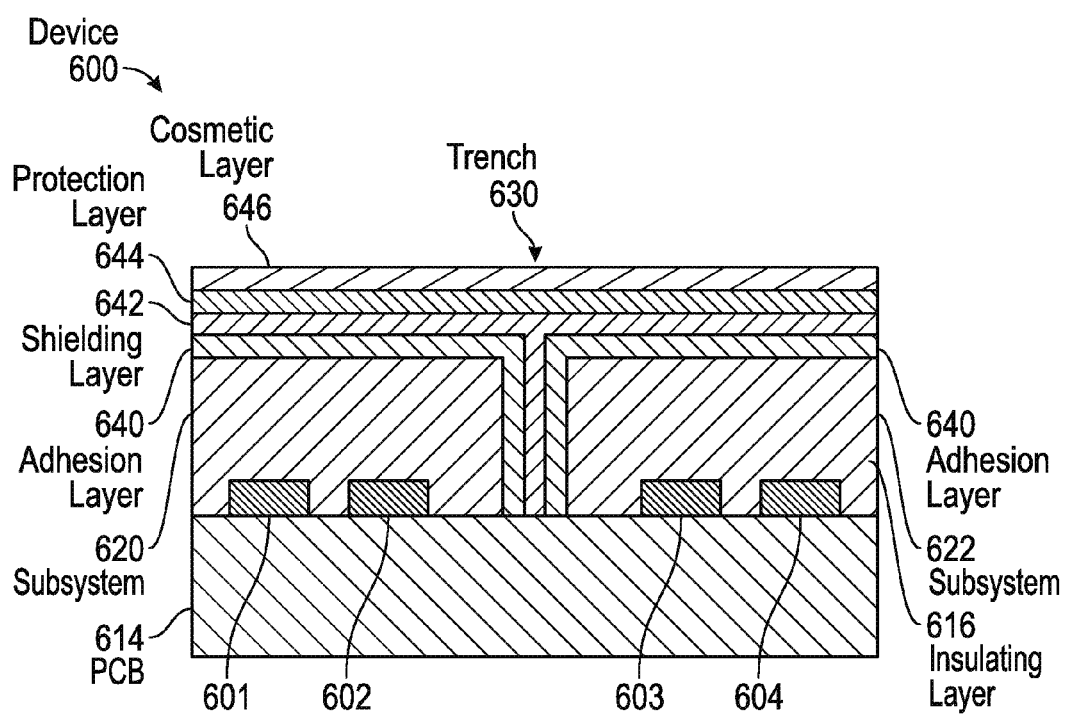
Figure 6D:
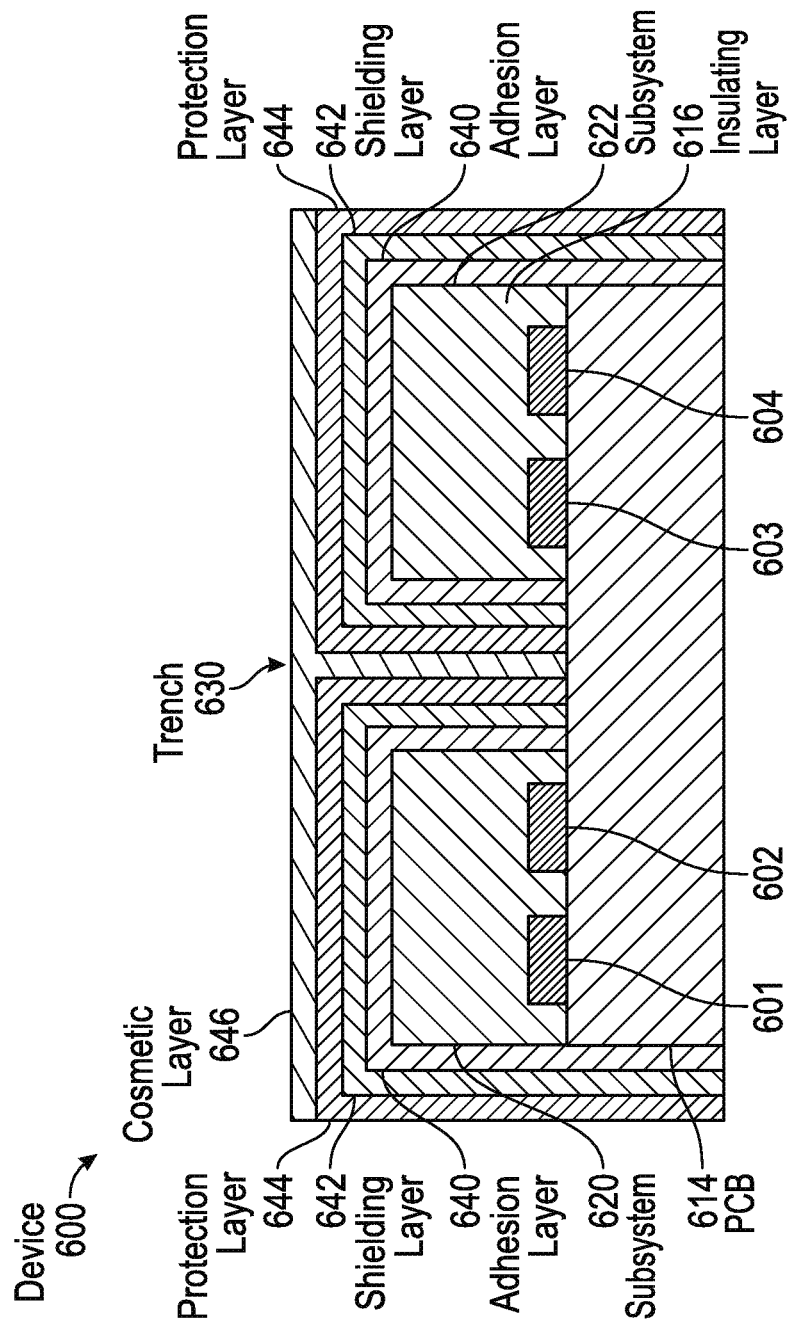
Figure 6E:
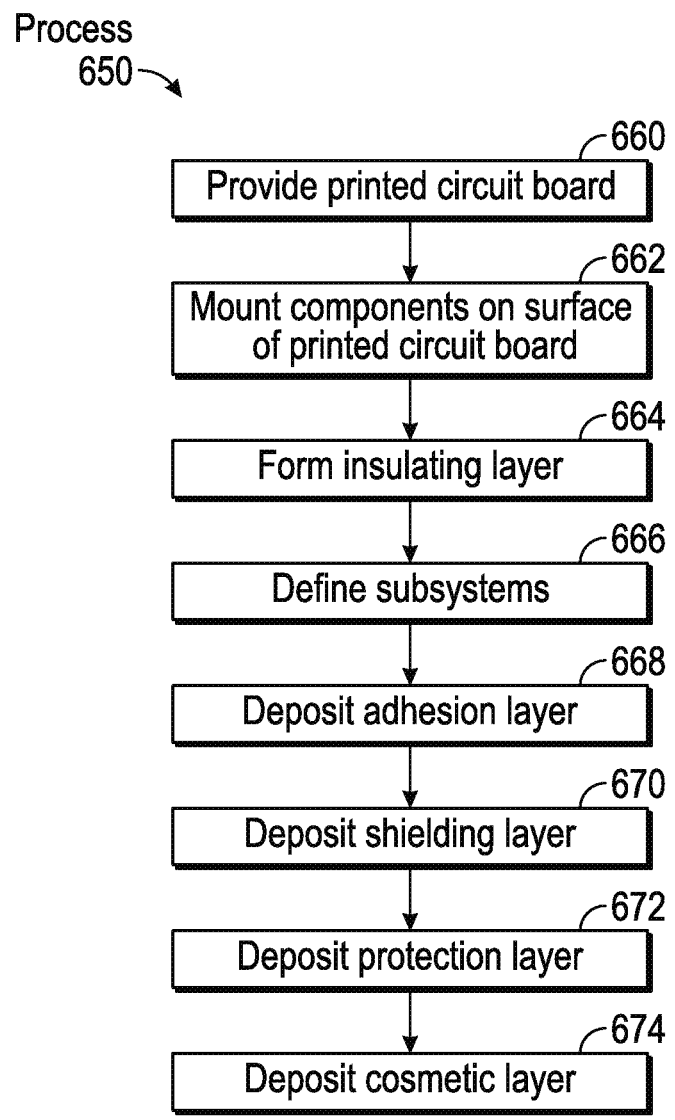
FIG. 6E illustrates a flow diagram of an exemplary process for forming an exemplary portable electronic device.

In some examples, the cosmetic layer 646 can be selectively deposited on top of the protection layer 644 without filling the trench 630, as shown in FIG. 6B. In some examples, both the cosmetic layer 626 and protection layer 644 can be selectively deposited on top of the shielding layer 642 without filling the trench 630, as shown in FIG. 6C. In some examples, one or more of the adhesion layer 640, shielding layer 642, protection layer 644, and cosmetic layer 646 can be deposited to conformally coat the sides of the assembly, as shown in FIG. 6D. In some examples, additional adhesion layers can be deposited between any of the layers in the multi-thin film stack. In some examples, the protection layer 644 can be deposited on the cosmetic layer 646. In some examples, the cosmetic layer 646 can be deposited between the shielding layer 642 and protection layer 644 or between the adhesion layer 640 and the shielding layer 642.

The adhesion layer 640, shielding layer 642, protection layer 644, and cosmetic layer 646 can be deposited using any number of deposition tools including chemical vapor deposition, physical vapor deposition, plating, printing, or spraying. In some examples, the layers of the multi-thin film stack can be deposited in the same system. In some examples, width of the trench 630 can be formed based on the thickness of the layers that fill the trench.

Figure 7A:
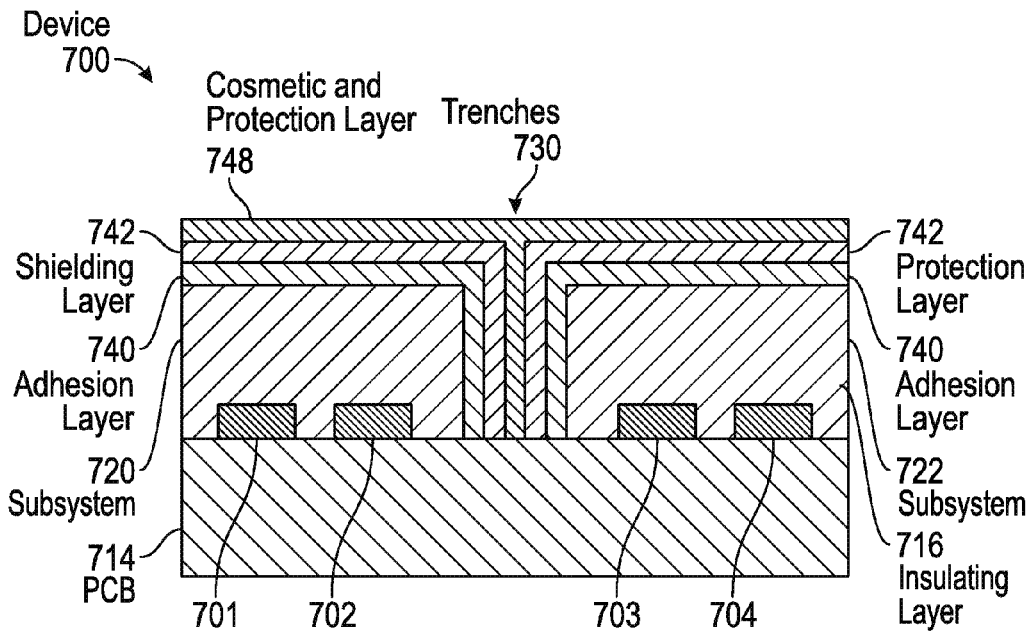
FIG. 7A illustrates a cross-sectional view of an exemplary portable electronic device packaged into a System-in-Package assembly with a multi-layer thin-film stack used as shielding.
Figure 7B:
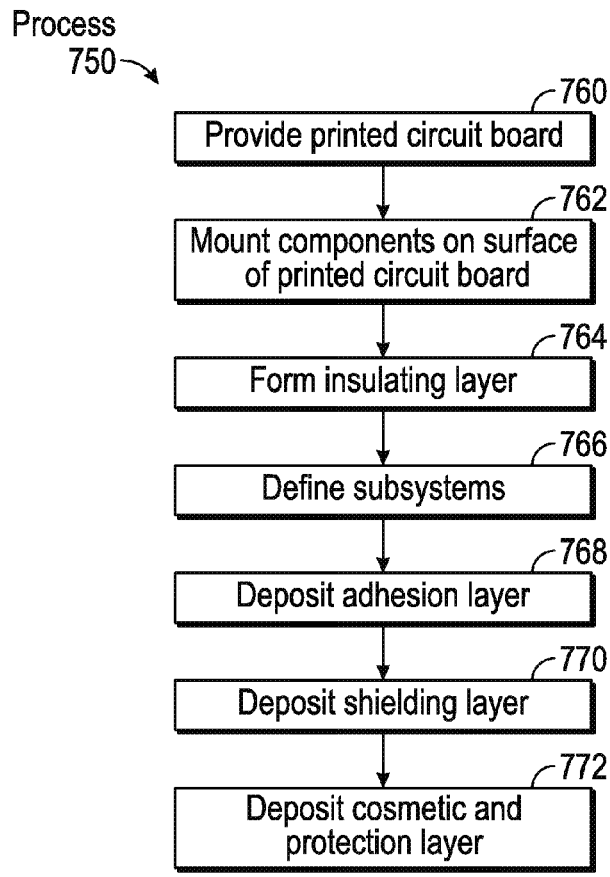
FIG. 7B illustrates a flow diagram of an exemplary process for forming an exemplary portable electronic device.

FIG. 7A illustrates a cross-sectional view of an exemplary portable electronic device packaged into a System-in-Package assembly with a multi-layer thin-film stack used as shielding. FIG. 7B illustrates a flow diagram of an exemplary process for forming the portable electronic device depicted in FIG. 7A. To reduce the width of trenches, thereby reducing the board size, one or more layers can be combined into multi-functional layers. For example, the cosmetic layer and protection layer can be combined.

Portable electronic device 700 can include a substrate or PCB 714. The PCB 714 can be provided in step 760 of process 750. In step 762, components 701-704 can be mounted or disposed on PCB 714 using any mounting technique and using any suitable mounting material such as solder.

In step 764, insulating layer 716 can be formed on PCB 714 using an injection process or deposition process as discussed earlier. Materials used for the insulting layer 716 can include an epoxy, over-molding materials, under-fill materials, heat shrink jackets, acrylic materials, dielectric materials, thermoset materials, thermoplastics, rubbers, plastics, or other desirable materials that provide electrical insulation. In step 766, subsystems 720 and 722 can be defined during the molding process or by cutting through the insulating layer 716 using any one of the cutting tools as described earlier.

In steps 768 and 770, adhesion layer 740 and shielding layer 742 can be deposited using any deposition technique such as chemical vapor deposition, physical vapor deposition, printing, or spray processes. In step 772, a multifunctional layer 748 can be deposited on the shielding layer 742 and in the trenches 730 using any one of the deposition techniques. In some examples, the multi-functional layer 748 can be a cosmetic and protection layer. The multi-functional layer or the cosmetic and protection layer 748 can be made of any material that has the desired aesthetic appeal and good corrosion resistance properties. Materials used for the cosmetic and protection layer 748 can include, but are not limited to, SiC, DLC, $MoS_2$, AlTiN, $B_4C$, AlTiN/(Mo, W)$S_2$, TiN, TiC, CrN, and ZrN. In some examples, the cosmetic and protection layer 748 can be made of an inert metal such as Gold or Platinum. The inert metal can help protect the shielding layer 742 and can have good resistance to environmental-induced degradation or discoloration. In some examples, multiple adhesion layers and/or multiple cosmetic and protection layers can be employed. In some examples, the multi-layer thin film stack can be deposited in a single integrated system to minimize or avoid defects, particles, or oxidation issues. In some examples, the thickness of the cosmetic and protection layer 748 can be between 100-1000 nm.

In some examples, an electronic device is disclosed. The electronic device may comprise: a substrate; and a system in package assembly including: a plurality of components mounted on the substrate, one or more subsystems, each subsystem including one or more of the plurality of components, and a multi-layer thin film stack disposed between the one or more subsystems, the multi-layer thin film stack up configured to shield the one or more subsystems from interference. Additionally or alternatively to one or more examples disclosed above, in other examples, the electronic device further comprises: an insulator disposed between the plurality of components and a shielding; and a plurality of trenches formed in the insulator, wherein a width of the plurality of trenches is between 10-100 microns. Additionally or alternatively to one or more examples disclosed above, in other examples, the multi-layer thin film stack comprises an adhesion layer, a shielding, a protector, and a cosmetic layer. Additionally or alternatively to one or more examples disclosed above, in other examples, the multi-layer thin film stack comprises an adhesion layer, the adhesion layer is made of stainless steel. Additionally or alternatively to one or more examples disclosed above, in other examples, the multi-layer thin film stack comprises an adhesion layer, a thickness of the adhesion layer is between 10-100 nm. Additionally or alternatively to one or more examples disclosed above, in other examples, the multi-layer thin film stack comprises a shielding. Additionally or alternatively to one or more examples disclosed above, in other examples, the multi-layer thin film stack comprises a shielding, the shielding is at least one of copper, nickel, and silver. Additionally or alternatively to one or more examples disclosed above, in other examples, the multi-layer thin film stack comprises a shielding, a thickness of the shielding is between 1-100 microns. Additionally or alternatively to one or more examples disclosed above, in other examples, the multi-layer thin film stack comprises a protector and the protector is stainless steel. Additionally or alternatively to one or more examples disclosed above, in other examples, the multi-layer thin film stack comprises a cosmetic layer, the cosmetic layer is at least one of Titanium Nitride (TiN), Gold (Au), Zirconium Nitride (ZrN), Diamond-like Carbon (DLC), Boron Carbide ($B_4C$), Molybdenum Disulfide ($MoS_2$), Aluminum Titanium Nitride (AlTiN), AlTiN/(Mo, W)$S_2$, Silicon Carbide (SiC), Chromium Nitride (CrN), Titanium Carbide (TiC), TiC/(Mo,W)$S_2$, Silver (Ag), Titanium Nitride (TiN) and Titanium Carbon Nitride (TiCN). Additionally or alternatively to one or more examples disclosed above, in other examples, the multi-layer thin film stack comprises a cosmetic layer, a thickness of the cosmetic layer is between 100-1000 nanometers. Additionally or alternatively to one or more examples disclosed above, in other examples, the multi-layer thin film stack comprises an adhesion layer, a shielding, and a multi-functional layer. Additionally or alternatively to one or more examples disclosed above, in other examples, the multi-layer thin film stack comprises a multi-functional layer, the multi-functional layer is at least one of Silicon Carbide (SiC), Diamond like Carbon (DLC), Molybdenum Sulfide ($MoS_2$), Aluminum Titanium Nitride (AlTiN), Boron Carbide ($B_4C$), AlTiN/(Mo,W)$S_2$, Titanium Nitride (TiN), Titanium Carbide (TiC), Chromium Nitride (CrN), and Zirconium Nitride (ZrN). Additionally or alternatively to one or more examples disclosed above, in other examples, the multi-layer thin film stack comprises a multi-functional layer, the multi-functional layer is an inert metal. Additionally or alternatively to one or more examples disclosed above, in other examples, the multi-layer thin film stack comprises a multi-functional layer, a thickness of the multi-functional layer is between 100-1000 nm. Additionally or alternatively to one or more examples disclosed above, in other examples, the multi-layer thin film stack comprises at least one of a protector, cosmetic layer, and a multi-functional layer, the device further comprising: an insulator disposed between the plurality of components and a shielding; and a plurality of trenches formed in the insulator, wherein at least one of the protector, the cosmetic layer, and the multi-functional layer substantially fills the plurality of trenches. Additionally or alternatively to one or more examples disclosed above, in other examples, the multi-functional layer is a cosmetic and protection layer.

In some examples, a method for forming an electronic device is disclosed. The method may comprise: forming a substrate; forming a system in package assembly including: mounting a plurality of components on the substrate; forming a multi-layer thin film stack disposed between one or more subsystems, the plurality of components included in the one or more subsystems, wherein the multi-layer thin film stack is configured to shield the one or more subsystems from interference. Additionally or alternatively to one or more examples disclosed above, in other examples, forming the multi-layer thin film stack comprises: depositing an adhesion layer; depositing a shielding; depositing a protector; and depositing a cosmetic layer. Additionally or alternatively to one or more examples disclosed above, in other examples, forming the multi-layer thin film stack comprises: depositing an adhesion layer; depositing a shielding; and depositing a multi-functional layer.

While various examples have been described above, it should be understood that they have been presented by way of example only, and not by way of limitation. Although examples have been fully described with reference to the accompanying drawings, the various diagrams can depict an example architecture or other configuration for this disclosure, which is done to aid in the understanding of the features and functionality that can be included in the disclosure. The disclosure is not restricted to the illustrated exemplary architectures or configurations, but can be implemented using a variety of alternative architectures and configurations. Additionally, although the disclosure is described above in terms of various examples and implementations, it should be understood that the various features and functionality described in one or more of the examples are not limited in their applicability to the particular example with which they are described. They instead can be applied alone or in some combination, to one or more of the other examples of the disclosure, whether or not such examples are described, whether or not such features are presented as being part of a described example. Thus, the breadth and scope of the present disclosure should not be limited by any of the above-described examples.

What is claimed is:

1. An electronic device, comprising:
    a substrate; and
    a system in package assembly including:
        a plurality of electronic components mounted on the substrate,
        one or more subsystems, each subsystem including two or more of the plurality of electronic components, each subsystem separated from an adjacent subsystem by one of a plurality of trenches, and each subsystem including an insulating layer surrounding the electronic components and forming substantially parallel walls of the plurality of trenches, and
        a multi-layer thin film stack disposed in the plurality of trenches and conformally coating at least sides of the one or more subsystems, the multi-layer thin film stack including:
            an adhesion layer disposed on the insulating layer,
            a cosmetic layer, and
            a shielding layer configured to shield the one or more subsystems from interference,
        wherein at least two layers of the multi-layer thin film stack contact the substrate within the plurality of trenches and at least one of the layers of the multi-layer thin film stack has a first portion parallel to the substrate and traversing one of the plurality of trenches and a second portion perpendicularly intersecting the substrate and the first portion.

2. The electronic device of claim 1, wherein the plurality of trenches are formed in the insulating layer, wherein a width of each of the plurality of trenches is between 10-100 microns.

3. The electronic device of claim 1, wherein the multi-layer thin film stack further comprises a protection layer.

4. The electronic device of claim 3, wherein the protection layer is stainless steel.

5. The electronic device of claim 1, wherein the adhesion layer is made of stainless steel.

6. The electronic device of claim 1, wherein a thickness of the adhesion layer is between 10-100 nm.

7. The electronic device of claim 1, wherein the shielding layer includes at least one of copper, nickel, and silver.

8. The electronic device of claim 1, wherein a thickness of the shielding layer is between 1-100 microns.

9. The electronic device of claim 1, wherein the cosmetic layer is at least one of Titanium Nitride (TiN), Gold (Au), Zirconium Nitride (ZrN), Diamond-like Carbon (DLC), Boron Carbide ($B_4C$), Molybdenum Disulfide ($MoS_2$), Aluminum Titanium Nitride (AlTiN), AlTiN/$(Mo,W)S_2$, Silicon Carbide (SiC), Chromium Nitride (CrN), Titanium Carbide (TiC), TiC/$(Mo,W)S_2$, Silver (Ag), Titanium Nitride (TiN) and Titanium Carbon Nitride (TiCN).

10. The electronic device of claim 1, wherein a thickness of the cosmetic layer is between 100-1000 nanometers.

11. The electronic device of claim 1, wherein the multi-layer thin film stack comprises a multi-functional layer, the multi-functional layer is at least one of Silicon Carbide (SiC), Diamond like Carbon (DLC), Molybdenum Sulfide ($MoS_2$), Aluminum Titanium Nitride (AlTiN), Boron Carbide ($B_4C$), AlTiN/$(Mo,W)S_2$, Titanium Nitride (TiN), Titanium Carbide (TiC), Chromium Nitride (CrN), and Zirconium Nitride (ZrN).

12. The electronic device of claim 1, wherein the cosmetic layer is a multi-functional layer configured as both a cosmetic layer and a protection layer.

13. The electronic device of claim 12, wherein a thickness of the multi-functional layer is between 100-1000 nm.

14. The electronic device of claim 1, wherein at least two layers of the multi-layer thin film stack are located between the walls of each trench and at least one layer of the multi-layer thin-film stack is located outside the walls of each trench.

15. The electronic device of claim 1, wherein at least one of layer of the multi-layer thin film stack is located between walls of each trench and includes a top surface that forms a planar surface.

16. The electronic device of claim 1, wherein the at least two layers contacting the substrate within the plurality of trenches includes the adhesion layer disposed on two adjacent subsystems and the shielding layer.

* * * * *